(12) United States Patent
Abbiate et al.

(10) Patent No.: US 6,563,346 B2
(45) Date of Patent: May 13, 2003

(54) PHASE INDEPENDENT FREQUENCY COMPARATOR

(75) Inventors: Jean-Claude Abbiate, La Gaude (FR); Carl Cederbaum, Nice (FR)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/683,319

(22) Filed: Dec. 13, 2001

(65) Prior Publication Data

US 2002/0070761 A1 Jun. 13, 2002

(30) Foreign Application Priority Data

Dec. 13, 2000 (EP) .............................. 00480120

(51) Int. Cl.[7] .................................. H03D 3/00
(52) U.S. Cl. .......................................... 327/48; 327/40
(58) Field of Search ........................... 327/3, 8, 39, 40, 327/43, 47–49, 12

(56) References Cited

U.S. PATENT DOCUMENTS 5,157,699 A * 10/1992 Miyazaki et al. ............. 327/47
6,333,646 B1 * 12/2001 Tsuzuki ........................ 327/47

* cited by examiner

Primary Examiner—Terry D. Cunningham
Assistant Examiner—Long Nguyen
(74) Attorney, Agent, or Firm—Anthony J. Canale; Robert A. Walsh

(57) ABSTRACT

A method and circuit for comparing the frequencies of two clocks (clock_1 and clock_2), without taking into account their phase, is disclosed. Each clock is associated to a circular counter (100-1 and 100-2) which are initialized to different values, and the contents of the circular counters are compared. When the frequencies of the two clocks (clock_1 and clock_2) are equal, both counters (100-1 and 100-2) are incremented at a common frequency and thus, due to the initialization conditions, the contents of both counters can never be equal. Conversely, when the frequencies of the two clocks are different, the counters (100-1 and 100-2) are not increased at a common frequency and thus, after several clock pulses, the contents of the counters are equal, indicating different clock frequencies. In a preferred embodiment, the circular counters (100-1 and 100-2) are 2-bit circular counters.

12 Claims, 4 Drawing Sheets

PHASE INDEPENDENT FREQUENCY COMPARATOR

BACKGROUND OF THE INVENTION

The present invention relates to digital clock systems and more specifically to phase independent frequency comparators generally used in such clock systems.

BACKGROUND OF THE INVENTION

The relentless quest for performance has driven the development of electronic systems in two directions. First, the dramatic increase of the level of integration on a semiconductor chip that has been achieved in recent years has allowed millions of transistors running at clock frequency values expressed in hundreds of megahertz or gigahertz for particular parts such as switch devices. Secondly, to delay technical limitations, the functions to be executed are often distributed among subsystems to perform tasks in parallel. While this approach reduces system response time drastically, its use requires care concerning operation synchronization. Such a situation is typically encountered in the field of computer networks and telecommunications where the data are processed simultaneously in several subsystems and so, may use several paths. Since most of the communication protocols require preserving the data packet order or the data processing order, it is highly desirable that the time required to perform a same data processing in different paths will be the same in each path. Thus, when each subsystem uses its own clock, it is highly desirable to control that their frequencies are equal. It is to be noticed that phase differences are generally negligible regarding path length and clock frequency and do not substantially affect subsystem response time. Such frequency controls are particularly important when changing system parts.

The most common approach to handle this problem is to adjust the phase of the clocks and then to compare their frequencies. However, such a solution presents several drawbacks. First, it requires hardware to perform both tasks, i.e. phase detection and frequency detection, that is surface consuming and increases the failure rate. Secondly, this solution is not adapted to compare variable frequencies.

BRIEF SUMMARY OF THE INVENTION

It is a broad object of the invention to remedy the shortcomings of the prior art as described hereinabove.

It is another object of the invention to provide a method and circuits to compare clock frequencies without taking into account their phases.

It is a further object of the invention to provide a method and circuits to compare variable clock frequencies without taking into account their phases.

The accomplishment of this and other related objects is achieved by a method of comparing the frequency of a first clock with the frequency of a second clock, using a first and a second circular counters having the same counting range and a comparator, the method comprising the steps of:

initializing the counters with two different values within the counting range;

increasing the content of the first circular counter after each pulse of the first clock;

increasing the content of the second circular counter after each pulse of the second clock; and, comparing the content of the second circular counter with the content of the first circular counter, where the frequencies of the two clocks are different if the contents of the first and second counters are equal.

Further advantages of the present invention will become apparent to ones skilled in the art upon examination of the drawings and detailed description. It is intended that any additional advantages be incorporated herein.

BRIEF DESCRIPTION OF THE SEVERAL VIEW OF THE DRAWINGS

Figure 4:
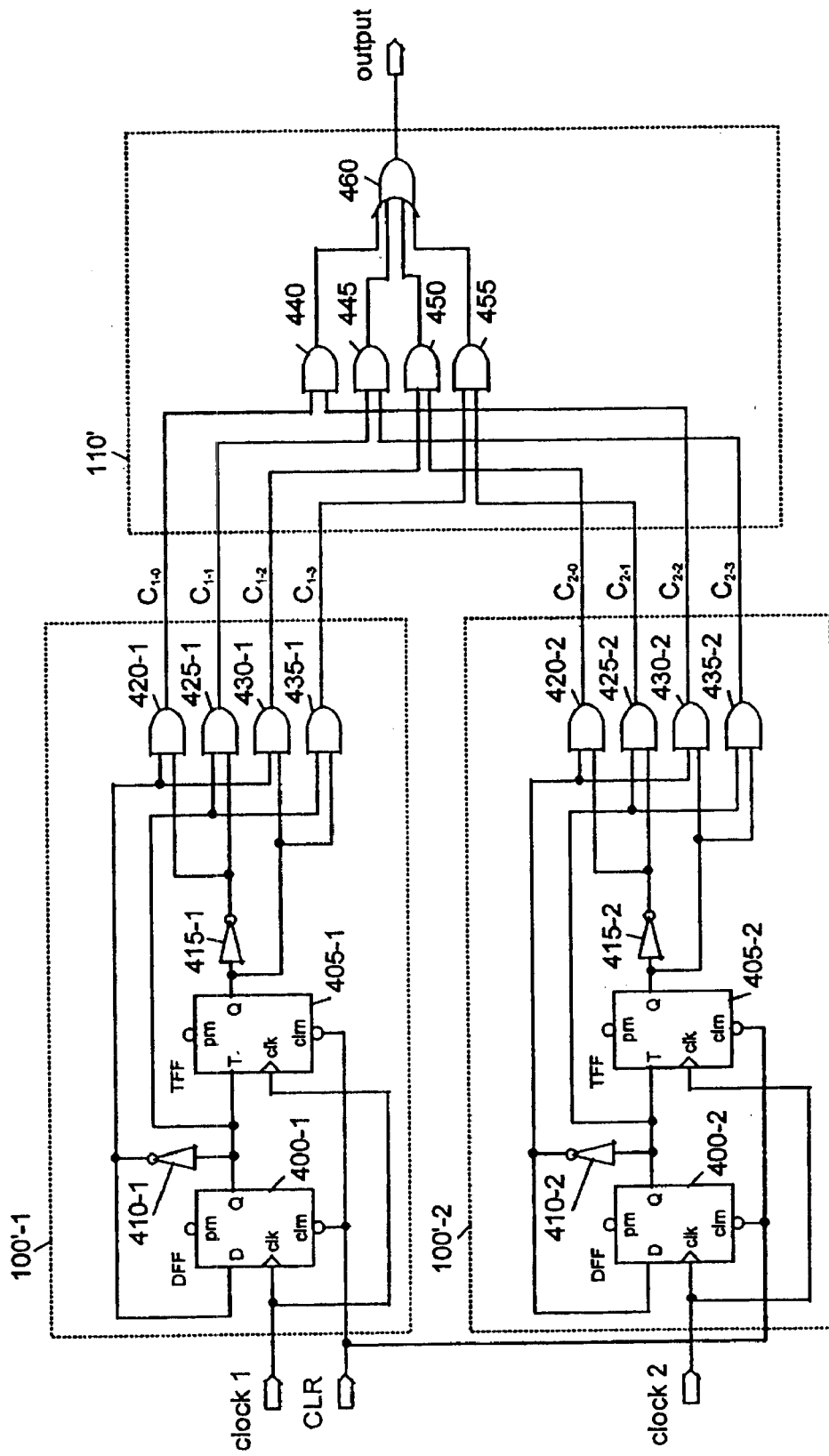

FIG. 4 describes a first implementation of the method of the present invention.

Figure 5:
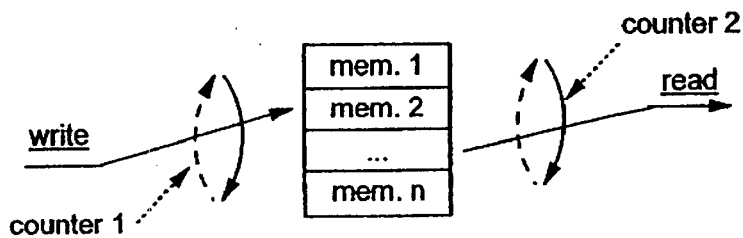

FIG. 5 depicts the use of a circular buffer according to the method of the present invention.

Figure 6:
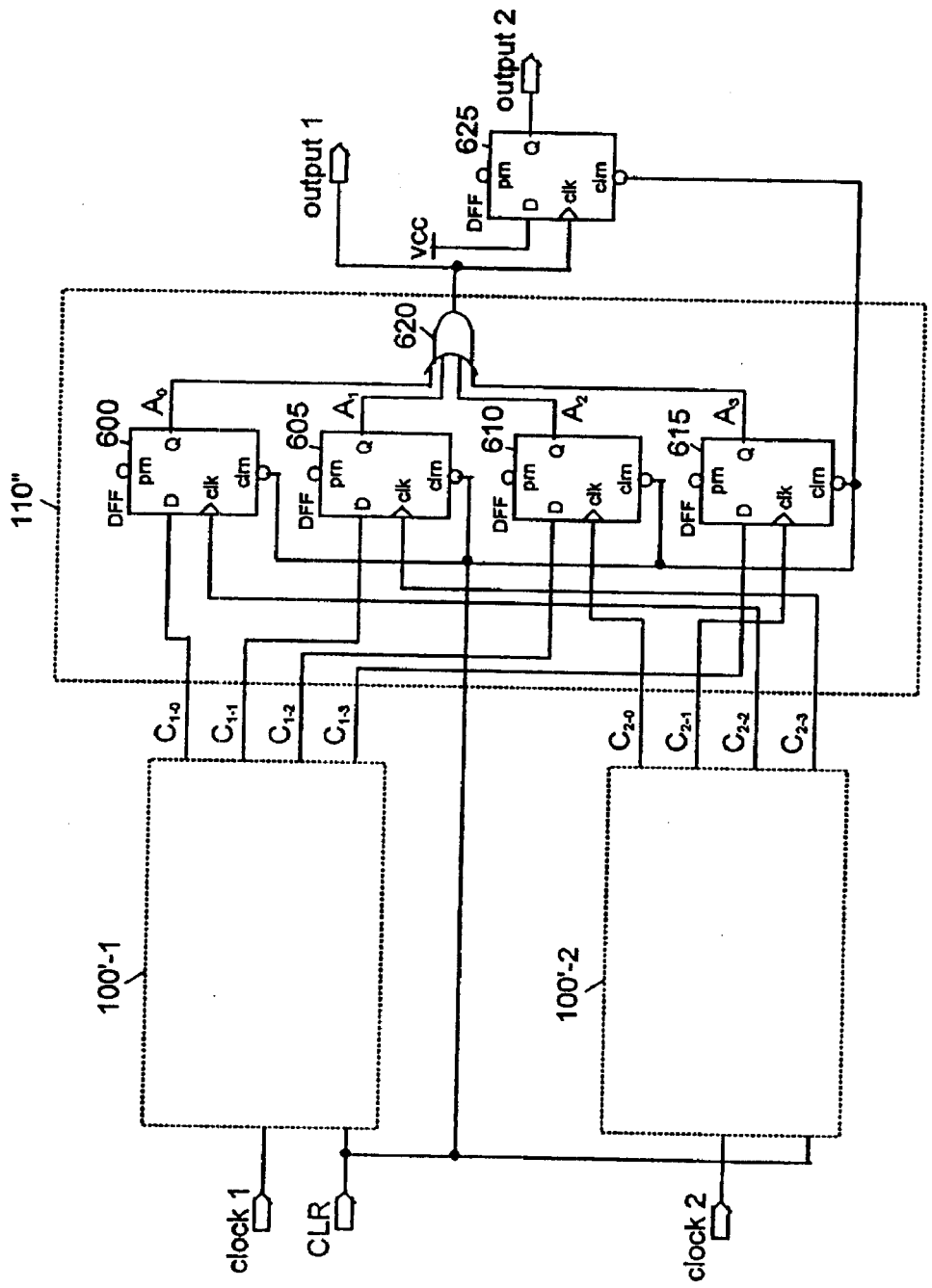
Figure 7:
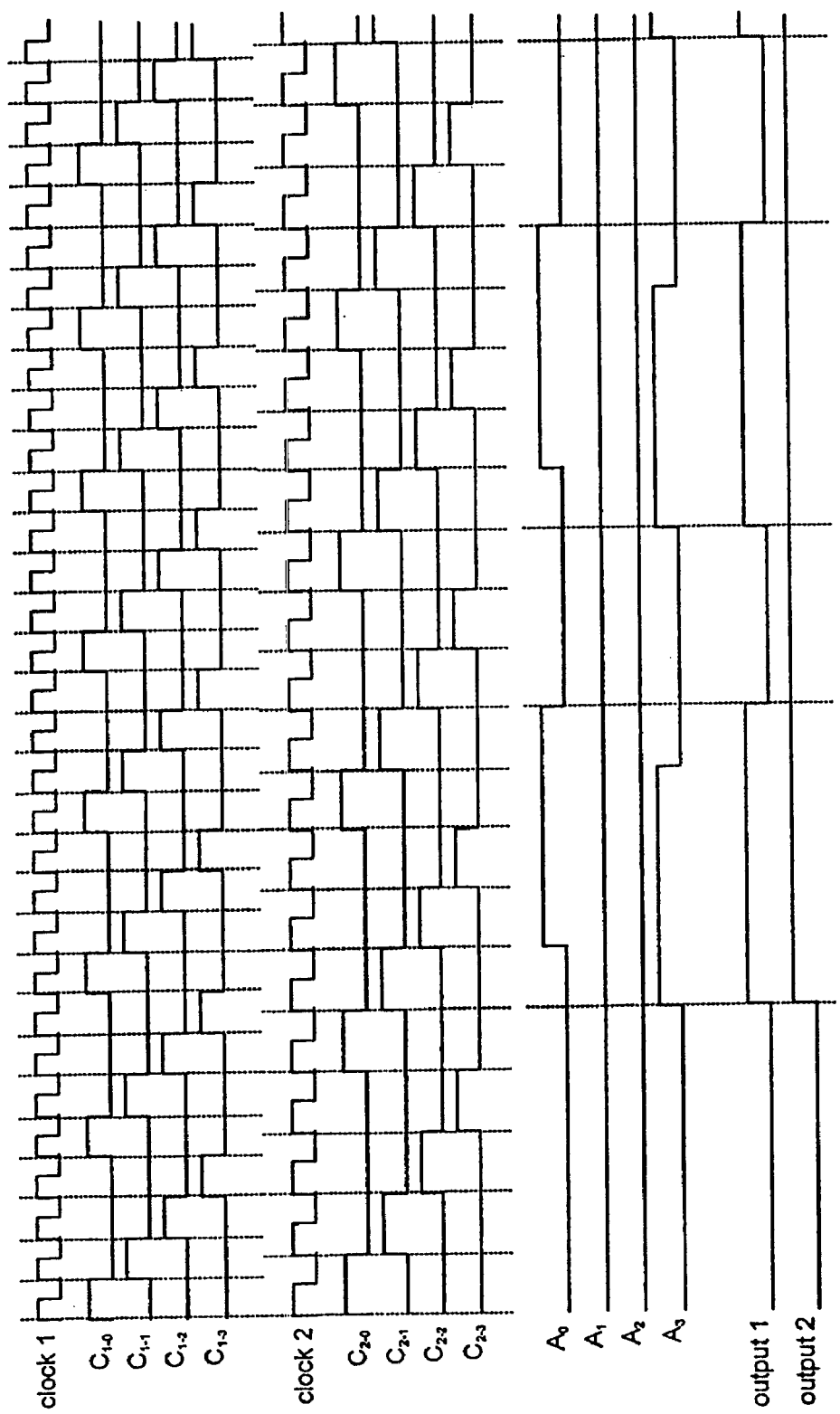

FIG. 6 illustrates a second implementation of the method of the present invention FIG. 7 is a timing diagram corresponding to the behavior of the second implementation of the method of the present invention when the frequencies of the clocks to be compared are different.

DETAILED DESCRIPTION OF THE INVENTION

According to the method of the present invention, the two clocks to be examined are used to control counters whose contents are compared to determine whether or not the clock frequencies are equal. If the frequencies of the two clocks are equal, the two counter contents are incremented at a same frequency and thus they are always equal or never equal depending upon the initialization conditions.

Figure 1:
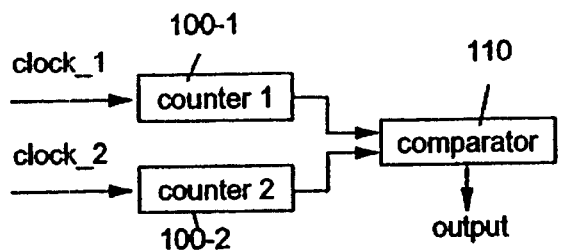
FIG. 1 illustrates the general principle of the present invention.

FIG. 1 illustrates the basic principle of the present invention. Clock_1 controls a first counter 100-1 so that the counter content is incremented at each clock_1 pulse. Likewise, clock_2 controls a second counter 100-2 as depicted on the drawing. Since the frequencies of the two clocks may be very close and the order of these frequencies is not known, i.e. the frequency of the first clock may be greater or less than the frequency of the second one, counters 100-1 and 100-2 are circular counters, i.e. counters are reset to their minimum value when they reach their maximum value. The minimum and maximum values that can be reached by counters 1 and 2 are equal, and their initialization values are different, e.g. the first value of the first counter is its minimum value and the first value of the second counter is a median value. Both counters 100-1 and 100-2 are fed into comparator 110 to determine whether or not the counters are equal. If counters 100-1 and 100-2 are equal, it means that frequencies of clock_1 and clock_2 are different. Depending upon the frequency ratio of clock_1 and clock_2 and their phase difference, counters 100-1 and 100-2 may be equal after several clock pulses. Since the initial phase difference between clock_1 and clock_2 is unknown and could be any value less than 360° (one cycle), the difference between the initial values of counters 100-1 and 100-2 must be equal or greater than two. Furthermore, since counters 100-1 and 100-2 are circular, the initial value of counter 100-1 must be different than the minimum value that can be reached by the circular counters 100-1 and 100-2 if the initial value of counter 100-2 is equal to the maximum value that can be reached by circular counters 100-1 and 100-2, and the reciprocal is also true.

In the following description, it is assumed that the comparator 110 output is equal to "1" if the inputs of the comparator 110 are equal, and the comparator 110 output is equal to "0" otherwise.

Figure 2:
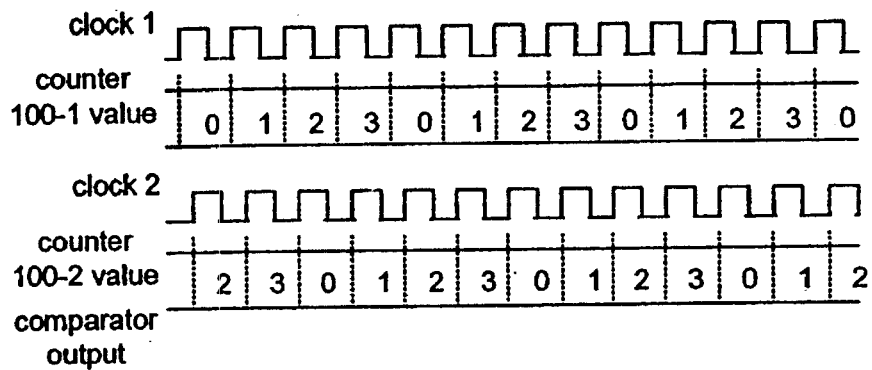
FIG. 2 is a first timing diagram illustrating the method of the present invention when the frequencies of the clocks to be compared are equal.

FIG. 2 illustrates a first timing diagram of the method described above with reference to FIG. 1 when the frequencies of clock_1 and clock_2 are equal. In this example, counters 100-1 and 100-2 are circular 2-bit counters, i.e. the contents of counter 100-1 and 100-2 vary from 0 to 3. As shown, counters 100-1 and 100-2 are incremented at each clock up-going edge, counter 100-1 starting at value 0 and counter 100-2 starting at value 2. Since the frequencies of clock_1 and clock_2 are the same, counters 100-1 and 100-2 are incremented at the same frequency and thus they are never equal. The output of comparator 110 is always equal to zero.

Figure 3:
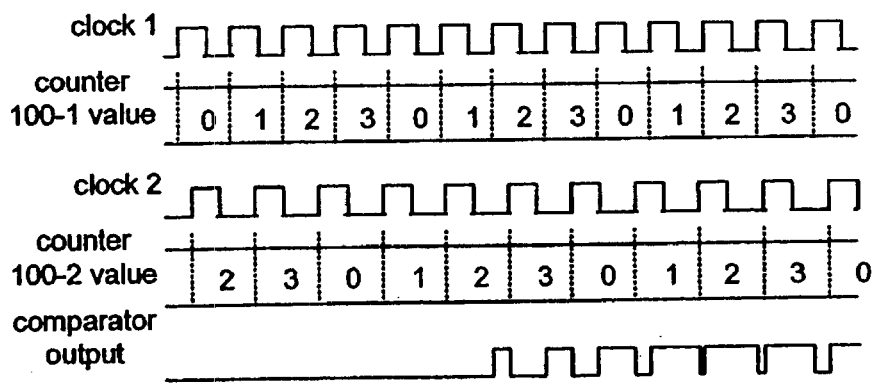
FIG. 3 is a second timing diagram illustrating the method of the present invention when the frequencies of the clocks to be compared are different.

FIG. 3 illustrates a second timing diagram of the method described above with reference to FIG. 1 when the frequencies of clock_1 and clock_2 are different. Due to the clock frequency difference, counters 100-1 and 100-2 are not increased at a common frequency and thus, after several clock pulses, counters 100-1 and 100-2 are equal. As depicted, the output of the comparator 110 that is equal to a value 0 when counters 100-1 and 100-2 are different changes to a value 1 when counters 100-1 and 100-2 are equal. It is to be noticed that, since the comparator 110 output is not latched, the time during which the comparator 110 is equal to a value 1 depends upon clock_1 and clock_2 frequencies and their phase difference that changes at each clock pulse.

FIGS. 2 and 3 show that the frequency comparison is independent of the phase difference.

FIG. 4 depicts an example of a circuit for implementing the above mentioned method of the present invention with reference to FIG. 1. The particular implementation of counters 100-1 and 100-2 and comparator 110 are now referenced 100'-1, 100'-2 and 110' respectively.

Counters 100'-1 and 100'-2 are circular synchronous 2-bit counters. As depicted, counters 100'-1 and 100'-2 are based on standard latches and logical gates. Clock_1, which controls counter 100'-1, is connected to the clock input of D-FlipFlop (D-FF) 400-1 and T-FlipFlop (T-FF) 405-1. Likewise a reset signal CLR is connected to the reset inputs of the D-FF 400-1 and T-FF 405-1. The Q output of D-FF 400-1 is connected to the inputs of T-FF 405-1, inverter 410-1 and AND gates 425-1 and 435-1. The inverter 410-1 output is connected to the inputs of D-FF 400-1 and AND gates 420-1 and 430-1. The Q output of T-FF 405-1 is connected to the inputs of inverter 415-1 and AND gates 430-1 and 435-1. The output of inverter 415-1 is connected to the inputs of AND gates 420-1 and 425-1. The output of AND gates 420-1, 425-1, 430-1 and 435-1 are referred to as $C_{1\text{-}0}$, $C_{1\text{-}1}$, $C_{1\text{-}2}$ and $C_{1\text{-}3}$ respectively and correspond to the outputs of counter 100'-1. A corresponding circuit is used for counter 100'-2 with the outputs for counter 100'-2 labeled as $C_{2\text{-}0}$, $C_{2\text{-}1}$, $C_{2\text{-}2}$ and $C_{2\text{-}3}$.

As illustrated, the counters 100'-1 and 100'-2 are circular counters that have as many outputs as possible values so that a value is characterized by the state of a single output. For example, if counter 100'-1 varies from zero to three and the value of counter 100'-1 is 1, the first, third and fourth outputs, i.e. $C_{1\text{-}0}$, $C_{1\text{-}2}$ and $C_{1\text{-}3}$, are equal to 0 and the second output, i.e. $C_{1\text{-}1}$, is equal to 1. FIG. 7 illustrates the behavior of counters 100'-1 and 100'-2.

Comparator 110', connected to counters 100'-1 and 100'-2, has four AND gates 440, 445, 450 and 455, OR gate 460, and an output. The inputs of AND gates 440, 445, 450 and 455 are connected to $C_{1\text{-}0}$ and $C_{2\text{-}2}$, $C_{1\text{-}1}$ and $C_{2\text{-}3}$, $C_{1\text{-}2}$ and $C_{2\text{-}0}$ and, $C_{1\text{-}3}$ and $C_{2\text{-}1}$ respectively, as illustrated in FIG. 4. The outputs of AND gates 440, 445, 450 and 455 are linked to the inputs of OR gate 460, and the output of OR gate 460 is the output of comparator 110'.

Comparator 110' detects equal output values of counters 100'-1 and 100'-2. To that end, the first value of counter 100'-1 is compared with the third value of counter 100'-2, the second value of counter 100'-1 with the fourth value of counter 100'-2, the third value of counter 100'-1 with the first value of counter 100'-2 and the fourth value of counter 100'-1 with the second value of counter 100'-2, to set different initial output values to counters 100'-1 and 100'-2, i.e. 0 and 2. Thus, if one of counters 100'-1 or 100'-2 is incremented more rapidly than the other, it can occur that one of the four values that can be reached by counters 100'-1 and 100'-2 will be the same for both of them. Since it can be anyone of these four values, the comparison results are merged in OR gate 460 so that the comparator output is set to a value of 1 whatever the common value of counter 100'-1 and 100'-2 is.

The timing diagrams of FIGS. 2 and 3 illustrate the behavior of the circuit represented in FIG. 4. As mentioned above, the frequencies of clock_1 and clock_2 are different if comparator 110' output is equal to a value of 1.

FIG. 5 illustrates the method of the present invention when using a circular buffer having n memory locations, in conjunction with the above mentioned circular counters. At initialization, the whole content of this circular buffer is cleared to a first value, and two different values are set in counters 1 and 2. As mentioned above, the difference between these values must be equal to or greater than 2, and the initial value of counter 1 must be different than the minimum value that can be reached by these circular counters if the initial value of counter 2 is equal to the maximum value that can be reached by the circular counters, and the reciprocal is also true. To compare the frequencies of clock_1 and clock_2, counter 1, associated to clock_1, determines an address in the circular buffer where a second value is written. When the next address, defined by the next counter 1 value, is determined, the written second value is cleared to the first value and the second value is written in the new address. Likewise, counter 2, associated to clock_2, determines addresses where memorized values are read. Since the counter values are different at initialization, read values are always equal to the first value if the circular buffer has at least four memory locations and the counters are incremented at the same frequency. Conversely, reading the second value means that the counters are not increased at a common frequency and thus, the frequencies of clock_1 and clock_2 are different.

FIG. 6 illustrates an implementation of the method of the present invention as described by reference to FIG. 5, to compare the frequencies of two clocks. Latches are used to simulate a circular buffer in which a first clock is used to write values while a second clock is used to read values. The read and write positions are incremented at each corresponding clock pulse. The frequencies of the two clocks are different if the read and write positions are the same.

Counters 100'-1 and 100'-2 of the circuit shown in FIG. 6 are the same as counters 100'-1 and 100'-2 shown in FIG. 4 and so, are not detailed again. Their output behavior is still represented on FIG. 7. The comparator 110" has four latches D-FFs 600, 605, 610 and 615. The reset signal CLR used to initialize counters 100'-1 and 100'-2 is connected to the reset inputs of D-FFs 600, 605, 610 and 615. Counter 100'-1 outputs $C_{1-0}$, $C_{1-1}$, $C_{1-2}$ and $C_{1-3}$ are linked to the D inputs of D-FFs 600, 605, 610 and 615 respectively. Counter 100'-2 outputs $C_{2-2}$, $C_{2-3}$, $C_{2-0}$ and $C_{2-1}$ are connected to the clock inputs of D-FFs 600, 605, 610 and 615 respectively. The Q outputs $A_0$, $A_1$, $A_2$ and $A_3$ of D-FFs 600, 605, 610 and 615 respectively are linked to the inputs of OR gate 620 that outputs as comparator 110" output_1. In most applications, the signal output_1 has to be latched to be used by another device such as a microprocessor. To that end, D-FF 625 can be used. Signal output_1 is connected to the clock input of D-FF 625 that D input is linked to VCC, i.e. to logic value one, and reset input to already mentioned reset signal CLR. The output of D-FF 625 is referred to as output_2. Thus, depending upon the application, either output_1 or output_2 can be used. It is to be noticed that, if output_2 is not used, D-FF 625 is not required.

FIG. 7 illustrates timing diagrams of counters 100'-1 and 100'-2 described with reference to FIGS. 4 and 6 when the frequencies of clock_1 and clock_2 are different, with a frequency ratio equal to about $\frac{2}{3}$. Furthermore, FIG. 7 depicts the states of signals $A_0$, $A_1$, $A_2$ and $A_3$ of comparator 110", as well as signals output_1 and output_2. In this example, the values 0 and 2 are achieved at the same time by counters 100'-1 and 100'-2, i.e. signal $A_0$ and $A_3$ values are periodically equal to one. As a consequence, the output of comparator 110" is equal to a value of 1 when either signals $A_0$ or $A_3$ is equal to 1, as illustrated by reference to signal output_1. If the output of comparator 110" is fed into D-FF 525, the state of its output, i.e. output_2, that is equal to a value of 0 after initialization, changes to a value of 1 when signal $A_3$ changes from 0 to 1 and keeps a value of 1 until the next initialization depending upon the CLR signal.

In the two above mentioned implementations, counters 100'-1 and 100'-2 are 2-bit circular counters. Since the initial phase difference between the two clocks is unknown and could be any value less than 360° (one cycle), any n-bit circular counters (with $n^32$) can be used. It is to be noticed that to improve system response time, n needs to be as close as possible to two.

While the invention has been described in term of preferred embodiments, those skilled in the art will recognize that the invention can be practiced with other circuit designs implementing the described method. Likewise, the circular counters can be initialized to a common value and thus, the frequency difference is characterized by detecting different values in the comparator. Furthermore, even if the description is based on the comparison of constant clock frequencies, the method of the invention is adapted to handle the comparison of variable clock frequencies without any modifications.

What is claimed is:

1. A method for comparing a first frequency of a first clock to a second frequency of a second clock, the method comprising the steps of:
   providing a first circular counter and a second circular counter having the same counting range;
   initializing said first circular counter with a first value and said second circular counter with a second value, the first and second values within said counting range;
   increasing the value of said first circular counter after each pulse of said first clock;
   increasing the value of said second circular counter after each pulse of said second clock; and,
   comparing the value of said second circular counter with the value of said first circular counter, wherein the first frequency of said first clock is different from the second frequency of said second clock if the values of said first and second circular counters are equal.

2. The method of claim 1, wherein the step of comparing comprises a circular buffer and the contents of said first and second circular counters define a first and a second address in said circular buffer, the method further comprises the steps of:
   writing a third value in each location of said circular buffer at initialization;
   writing after each pulse of said first clock said third value at a location defined by the content of said first circular counter in said circular buffer before executing said step of increasing the content of said first circular counter;
   writing a fourth value at a location defined by the content of said first circular counter in said circular buffer after having executed said step of increasing the content of said first circular counter; and,
   reading a fifth value at a location defined by the content of said second circular counter from said circular buffer after each pulse of said second clock and after having executed said step of increasing the content of said second circular counter, wherein the first frequency of said first clock is different from the second frequency of said second clock if the fifth value is equal to fourth value.

3. The method of claim 1, wherein said first and second circular counters are 2-bit circular counters.

4. The method of claim 2, wherein said circular buffer comprises four memory locations.

5. A circuit to compare a first frequency of a first clock to a second frequency of a second clock, the circuit comprising:
   a first circular counter controlled by said first clock;
   a second circular counter controlled by said second clock, wherein a counting range of said second circular counter is the same as a counting range of said first circular counter; and,
   a comparator which determines whether or not the contents of said first and second circular counters are equal, wherein an output of said comparator indicates whether or not the first frequency of said first clock and the second frequency of said second clock are equal.

6. The circuit of claim 5, wherein said first and second circular counters are 2-bit circular counters.

7. The circuit of claim 5, wherein said first and second circular counters comprise as many outputs as a number of possible values that can be reached by said first and second circular counters so that a state of one output of said first or second circular counters characterizes the value of said first or second circular counters.

8. The circuit of claim 7, wherein said comparator comprises as many comparing means as outputs of said first and second circular counters.

9. The circuit of claim 8, wherein said comparator comprises AND gates.

10. The circuit of claim 8, wherein said comparator comprises D-FlipFlop latches.

11. The circuit of claim 5 further comprising a storage device to store the output of said comparator when the contents of said first and second circular counters are equal.

12. The circuit of claim 11, wherein the storage device comprises a D-FlipFlop latch.

* * * * *